(12) United States Patent
Jaber et al.

(10) Patent No.: US 7,437,634 B2
(45) Date of Patent: Oct. 14, 2008

(54) TEST SCAN CELLS

(75) Inventors: Talal K. Jaber, Austin, TX (US); Anil K. Sabbavarapu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 563 days.

(21) Appl. No.: 10/436,775

(22) Filed: May 13, 2003

(65) Prior Publication Data

US 2004/0243896 A1    Dec. 2, 2004

(51) Int. Cl.
*G01R 31/28* (2006.01)
*H03K 3/289* (2006.01)

(52) U.S. Cl. .................. 714/726; 714/729; 327/202

(58) Field of Classification Search ............ 714/726, 714/729

See application file for complete search history.

(56) References Cited

U.S. PATENT DOCUMENTS

| | | | |
|---|---|---|---|
| 4,553,236 A * | 11/1985 | Zasio et al. ............... 714/731 |
| 5,172,011 A * | 12/1992 | Leuthold et al. ........... 327/202 |
| 5,173,904 A * | 12/1992 | Daniels et al. ............. 714/729 |
| 5,574,733 A | 11/1996 | Kim |
| 5,774,473 A * | 6/1998 | Harley ....................... 714/30 |
| 6,023,778 A | 2/2000 | Li .............................. 714/726 |
| 6,240,536 B1 * | 5/2001 | Mikan et al. ............... 714/727 |
| 6,815,977 B2 * | 11/2004 | Sabbavarapu et al. ...... 326/16 |
| 2003/0093733 A1 * | 5/2003 | Zhang ......................... 714/726 |

OTHER PUBLICATIONS

Designs with Multiple Clock Domains: Avoiding Clock Skew and Reducing Pattern Count Using DFTAdvisor and Fastscant, Mentor Graphics Corporation, Mar. 2001, pp. 1-22.*
"Designs with Multiple Clock Domains: Avoiding Clock Skew and Reducing Pattern Count Using DFTAdvisor and FastScan", www.mentor.com/dft,1-22.
"Embedded Deterministic Test (EDT tm)-DFT Technology for High-Quality Low-Cost Manufacturing Test", *Mentor Graphics Corporation*, 1-17.
Bayraktaroglu, Ismet, et al., "Improved Methods for Fault Diagnosis in Scan-Based BIST", 4 pgs.
Cheung, Benson, et al., "The Seven Deadly Sins of Scan-Based Designs", www.eedesign.com, (Apr. 2, 2003), 7 pgs.
Tendolkar, Nandu, et al., "Scan-Based At-Speed Testing for the Fastest Chips", www.mentor.com/dft, 1-9.

* cited by examiner

*Primary Examiner*—Jacques Louis-Jacques
*Assistant Examiner*—John J. Tabone, Jr.
(74) *Attorney, Agent, or Firm*—Schwegman, Lundberg & Woessner, P.A.

(57) ABSTRACT

A sequential scan cell includes an input port for functional data and an input for scan test data. The input for scan test data is an input to a master scan flip-flop coupled to a slave scan flip-flop defining a scan test circuit. Such a scan test circuit is coupled to the functional circuit of the sequential scan cell such that the path for a functional signal is not through the scan test circuit, imparting no performance penalty to the functional signal. Scan test data is scanned in and out of the sequential cell by two non-overlapping scan clocks that are active only when system functional clocks are in an off state.

25 Claims, 7 Drawing Sheets

TEST SCAN CELLS

TECHNICAL FIELD

Embodiments of the invention relate generally to scan based cell processors.

BACKGROUND

Integrated circuits are becoming more densely packed with increasing numbers of individual circuit elements. Typically, testing these circuit elements is performed by generating a test pattern and applying the test pattern to the inputs of the integrated circuit using multiplexed, "mux," scan flip-flops. Depending on the test pattern, the responses of the integrated circuit to the test pattern can provide an accurate indication of the existence or non-existence of defects.

A scan mode signal is sent to the integrated circuit to effect either a system mode or a test mode. In system mode, the integrated circuit functions according to its designed application. In test mode, the integrated circuit receives test patterns and performs other test operations. One such integrated circuit that is tested in a scan mode is a microprocessor.

The internal circuitry of a microprocessor is often separated into combinational blocks and sequential blocks, the sequential blocks comprising clocked circuitry such as flip-flops. A circuit used for testing combinational and sequential circuit blocks in a microprocessor is a "scan chain." A scan chain includes a plurality of storage elements that are cascaded such that the output of a first storage element is coupled to the input of the next stage storage element. Scan chains thus allow testing of microprocessor circuit blocks by serially scanning in test patterns to the storage elements. The test patterns are then applied to the circuit blocks, and circuit test results are serially scanned out.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Figure 1:
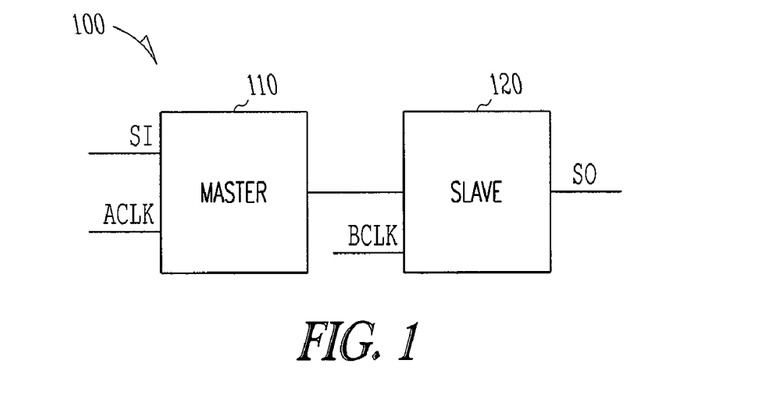
FIG. 1 illustrates a block diagram of an embodiment of a scan circuit, in accordance with the present invention.

FIG. 1 illustrates a block diagram of an embodiment of a scan circuit 100 having two sections, a master 110 and a slave 120, used to provide control for testing. Scan circuit 100 may be used to support automated test pattern generation (ATPG) based manufacturing scan test and system debug. Master 110 is configured to receive input scan data, SI, and a scan clock signal, ACLK. Slave 120 is coupled to master 110 to receive an output from master 110, and has an input to receive a second scan clock signal, BCLK. Slave 120 provides output scan data, SO. The scan signals, ACLK and BCLK, are non-overlapping clock signals. Further, ACLK and BCLK are completely decoupled from a system functional clock signal such that they are active when the system functional clock signal is in an off state. ACLK and BCLK clock signals may be routed from a source different than a source from which the system functional clock signal is routed. In an embodiment, ACLK and BCLK run at a relatively slow speed around 200 MHZ. ACLK and BCLK scan clock signals are not so limited as to running at a relatively slow speed, but can be run at higher speeds compatible with testing procedures and testing apparatus. Scan circuit 100 provides a modular unit such that it can be coupled to a functional portion of application circuitry in an add-on or "bolted on" fashion. This design allows scan circuit 100 to be used without being in the path of the functional portion of the application circuit. In an embodiment, master 110 is a master scan flip-flop and slave 120 is a slave scan flip-flop.

Scan circuit 100 provides modular design approach for a scan based sequential cell design for use in microprocessor and application-specific integrated circuit (ASIC) scan based cell designs. With scan circuit 100 incorporated as addition to a functional portions of an application circuit, there is no performance penalty to a functional signal of the application circuit. The functional signal does not have a path through scan circuit 100 providing no delay impact to the application circuit. With ACLK and BCLK completely decoupled from the system functional clock signal, these scan clocks are off when the application circuit is in functional application mode, resulting in no power dissipation in scan circuit 100. Additionally, scan circuit 100 can be constructed such that it has limited area overhead on an integrated circuit. The modular nature of scan circuit 100 allows it to be applied in various embodiments of scan cell types.

In an embodiment, a modular scan circuit may used in a scanned sequential cell. A sequential scan cell is a sequential cell that in addition to a data port also includes a scan port, or test port. The data port receives data used during the application of a function of codes, while the scan port receives test data. As the processor, or ASIC depending on the application, is running a functional code for an application, the data port is exercised, while the scan port is not. In an embodiment, the scan port is provided for the purpose of testing logic of the application circuit.

The sequential scan cells are strung together into a scan chain. Test data is piped into the scan chain for the purpose or applying test stimulus to the circuit under test and also for the purpose of capturing and scanning out data through only one input/output (I/O) port, or pin, or through a limited number of I/O pins. In the various embodiments, ACLK scan clock signal is used to "scan in" test data, also called scan data or scan input, a system functional clock is used to stimulate the circuit to test the circuit logic using the scan data, and BCLK scan clock signal is used to "scan out" the test result. In an embodiment, ACLK and BCLK are decoupled from system functional clocks such that ACLK and BCLK are active when the system functional clock is in an off state. Further, ACLK and BCLK are not part of a system clock tree or a system clock gird from which system functional clocks are provided.

Figure 2:
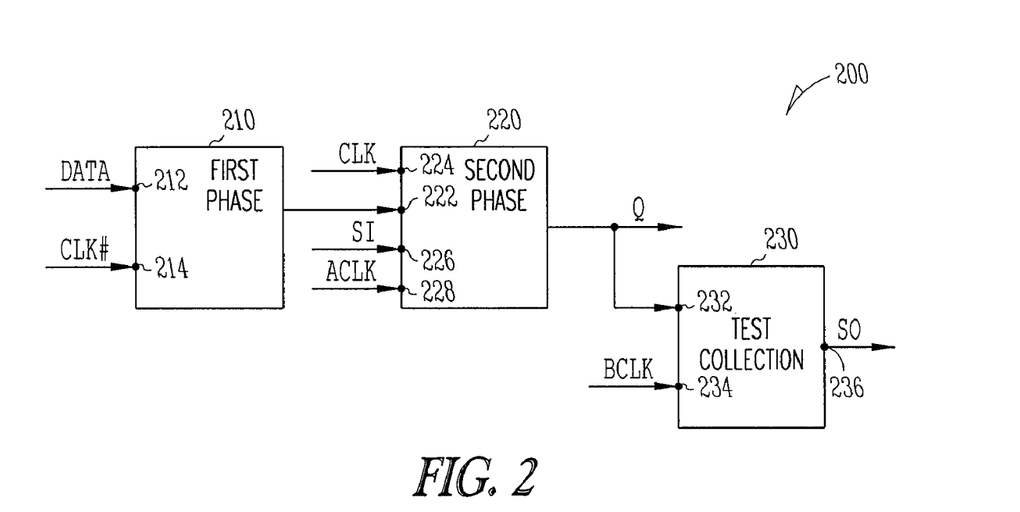
FIG. 2 depicts a logic view of an embodiment of a sequential scan cell incorporating a modular scan circuit, in accordance with the present invention.

FIG. 2 depicts a logic view of an embodiment of a sequential scan cell 200 incorporating a modular scan circuit. Sequential scan cell 200 can be viewed from a logic perspective as having a first phase 210, a second phase 220, and a test collection section 230. First phase 210 has an input 212 to receive DATA and an input 214 to receive an inverse, CLK #, of a clock signal, CLK. CLK signal is a functional clock signal associated with sequential cell 200 for processing the DATA according to the application of which the sequential cell is part. Second Phase 220 has input 222 to receive the output of first phase 210 processing the DATA and input 224 to receive the functional CLK signal. The application using first phase 210 and second phase 220 process DATA input to provide a functional output, Q.

Second Phase 220 also has an input 226 to receive a scan input data signal, SI, and an input 228 to receive a first scan clock signal, ACLK. SI and ACLK are provided to second phase 220 for testing application logic of the integrated circuit. ACLK is decoupled from the CLK signal, where decoupling involves the CLK being in an off state when ACLK is in an active state. Also, the CLK signal and ACLK are derived from different sources.

Test collection section 230 has an input 232, which is coupled to second phase 220 to provide the Q output. Collection of the Q output by test collection section 230 is controlled by a second scan clock signal, BCLK, at input 234. Test collection section 230 outputs the Q output as a scan output, SO, in response to BCLK. BCLK is decoupled from the CLK signal. The pulses of BCLK do not occur in the same time interval as the pulses of ACLK, making BCLK and ACLK non-overlapping signals. With the ACLK and BCLK scan clock signals non-overlapping, a minimum delay timing margin between the ACLK and BCLK scan clock signals is not required.

In an embodiment, the ACLK and BCLK scan clock signals do not originate from a clock tree or a clock grid. Thus, ACLK and BCLK signals may be routed from a source different than a source from which the system functional clock signal is routed. They are further decoupled from the system functional clocks such that if the processor is running a functional code, the ACLK and BCLK clock signals are idle, and there is no power dissipation due to these ACLK and BCLK scan clock signals. The ACLK and BCLK scan clock signals are generated at a level of a logical function block. Designs are typically described or generated at logical function block levels and these logical function block levels are put together to form the processor chip. A collection of logical function blocks form a logical unit, and a collection of logical units form a cluster, where a microprocessor can be viewed as a collection of logical clusters. By enabling the ACLK and BCLK scan clock signals at the logical function block level, design complexity in routing these two scan clocks globally across a chip is reduced. This may be accomplished through a global signal that is treated as any other native signal on the processor, and not dealt with as a clock tree or as a clock grid. The global signal is another data signal that is pipelined (transmitted as a direct channel) by stages through the logical hierarchies of the processor down to the node of the logical function block using ACLK and BCLK scan clock signals. The need to distribute these ACLK and BCLK scan clock signals as clock trees globally is eliminated.

The functional system clock may be generated from a clock tree or a clock grid. The scan clock signals, ACLK and BCLK, have a source separate from the source of the functional system clock to completely decouple the scan clock signals from the functional system clock. This reduces the load on the clock grid and eliminates the need to gate the ACLK and BCLK scan clocks during application functions for power consumption control. The system clock is for clocking during application mode, while the ACLK and BCLK scan clock signals, along with a scan control signal, is used in a test mode. In an embodiment, ACLK and BCLK scan clock signals are active for testing only when the functional system clock is in an off state.

Figure 3:
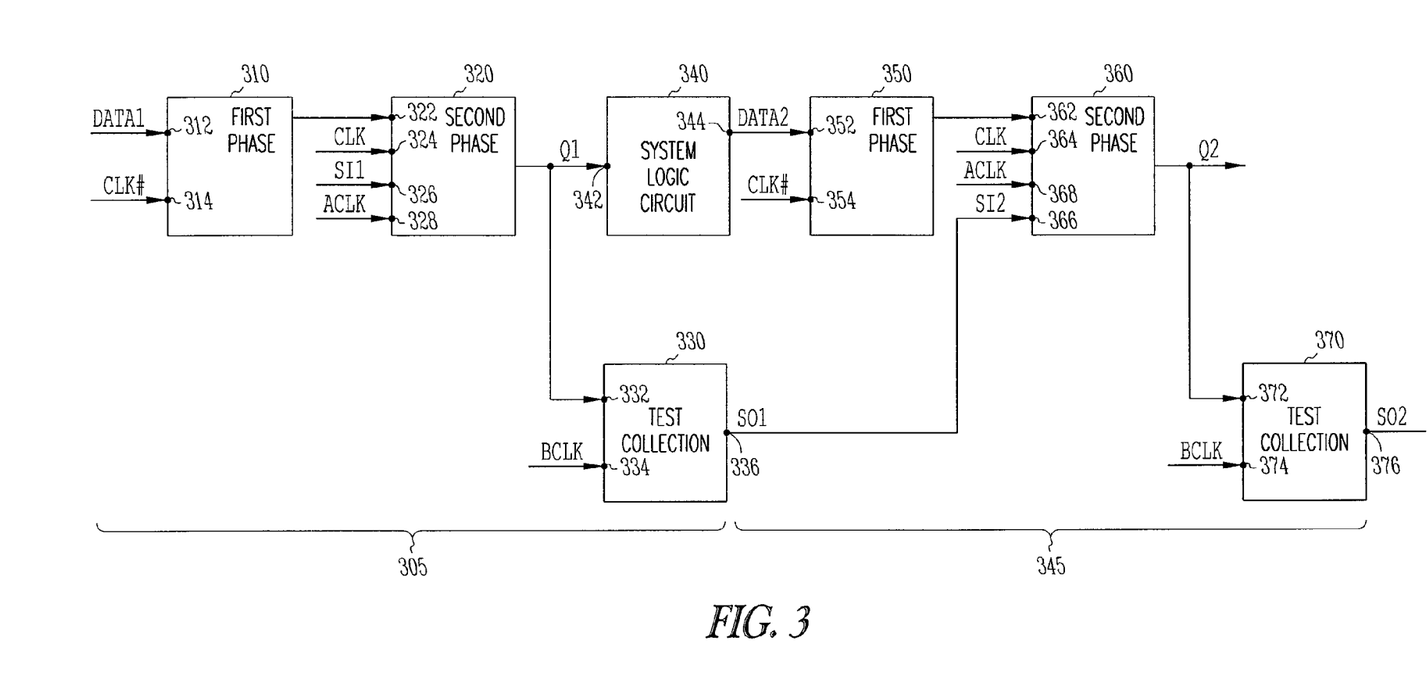
FIG. 3 depicts a logic view of an embodiment of two sequential cells in which the scan output of the first sequential cell is provided as scan input for the second sequential cell, in accordance with the present invention.

FIG. 3 depicts a logic view of two sequential scan cells, 305 and 345, in which the scan output, SO1, of the first sequential cell 305 is provided as scan input, SI2, for the second sequential cell 345. FIG. 3 effectively illustrates the sequential connection of two sequential cells, where each sequential cell is as depicted in FIG. 2. Sequential scan cell 305 can be viewed from a logic perspective as having a first phase 310, a second phase 320, and a test collection section 330. First phase 310 has an input 312 to receive DATA1 and an input 314 to receive an inverse signal, CLK #, of a clock signal, CLK. CLK signal is a functional clock signal associated with an application using sequential cells 305, 345 for processing DATA1.

Second Phase 320 has input 322 to receive the output of first phase 310 on processing the DATA1 and input 324 to receive the functional CLK signal. The application using first phase 310 and second phase 320 processes DATA1 input to provide a functional output, Q1. Second Phase 320 also has an input 326 to receive a scan input data signal, SI1, and an input 328 to receive a first scan clock signal, ACLK. SI1 and ACLK are provided to second phase 320 for testing the application logic of a sequential chain including sequential scan cells 305, 345. ACLK is decoupled from the CLK signal such that the CLK is in an off state when ACLK is in an active state. Also, CLK signal and ACLK signal are derived from different sources.

Test collection section 330 has an input 332, which is coupled to second phase 320 to provide the Q1 output. Collection of the Q1 output by test collection section 330 is controlled by a second scan clock signal, BCLK, at input 334. Test collection section 330 outputs the Q1 output at output 336 as a scan output, SO1, in response to BCLK. BCLK is also decoupled from the CLK signal. BCLK and ACLK scan clock signals are non-overlapping clock signals.

The Q1 output is provided to system logic circuit 340. System logic circuit 340 is a portion of the application circuitry of the integrated circuit in which sequential scan cells 305, 345 are embedded. System logic circuit 340 includes an input 342 and an output 344. Input 342 in functional mode receives functional data for which the system logic circuit 340 is designed to process and provides the result of the logic process at output 344. The signal at output 344 is eventually passed to a next system logic circuit. In an embodiment, system logic circuit 340 includes a combinatorial logic circuit.

Sequential scan cell 345 can be viewed from a logic perspective as having a first phase 350, a second phase 360, and a test collection section 370. First phase 350 has an input 352 to receive DATA2, which is a result of system logic circuit 340, and an input 354 to receive CLK # signal. Second Phase 360 has input 362 to receive the output of system logic circuit 340 processing DATA2 and input 324 to receive the functional CLK signal. The application using first phase 350 and second phase 360 process data input to provide a functional output, Q2. Second Phase 360 also has an input 366 to receive a scan input data signal, SI2, and an input 368 to receive ACLK. SI2 and ACLK are provided to second phase 360 for testing, where SI2 is SO1 of sequential cell 305.

Test collection section 370 has an input 372, which is coupled to second phase 360 to provide the Q2 output. Collection of the Q2 output by test collection section 370 is controlled by BCLK at input 374. Test collection section 370 outputs the Q2 output as a scan output, SO2, in response to BCLK. SO2 can be provided as scan input to a next sequential cell in a sequential chain or as a final scan output to be provided for test analysis.

In an embodiment, a scan based processor, or a scan based ASIC device, includes a number of sequential cells having a master scan flip-flop responsive to a first scan clock signal, or master scan clock signal, and a slave scan flip-flop responsive to a second scan clock signal, or slave scan clock signal. The first scan clock signal and the second scan clock signal are non-overlapping clock signals. They are decoupled from the system functional clocks such that they are activated for use in a number of sequential cells when the system functional clock signal is placed in an off state for testing. The last of these sequential cells may provide an output to be captured by a test system for analyzing the logic response to a test pattern input as scan input at the first sequential scan cell of the number of sequential cells. Further, the scan based processor, or scan based ASIC device, may include a number of chains of sequential scan cells, where each chain has an output to provide scan test outputs for the specific chain.

In operation, test data is scanned into SI1 input 326 using ACLK scan clock signal at a time when the system functional clock is in an off-state. With the test data scanned in and ACLK and BCLK off, the system functional clock signal is placed in an on state to stimulate system logic circuit 340. Then, with the system functional clock signal in the off state, BCLK scans the Q2 data captured as a result of stimulating the system logic circuit 340 to the SO2 output 376. This procedure provides a test of the system logic circuit 340. In embodiments using a sequential scan chain, a test of a combined set of system logic circuits can be performed.

Figure 4:
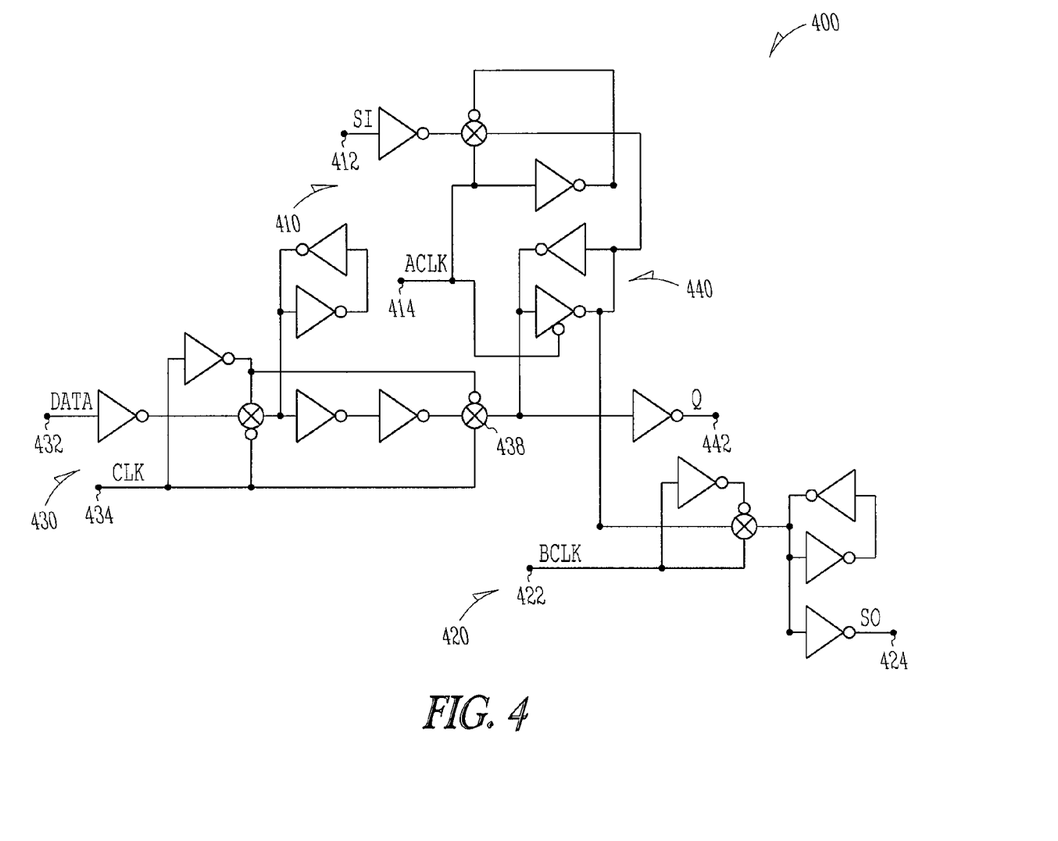
FIG. 4 illustrates an embodiment of a sequential scan cell having a modular master scan flip-flop and a slave scan flip-flop applied to a functional flip-flop arrangement for an application circuit, in accordance with the present invention.

FIG. 4 illustrates an embodiment of a sequential scan cell 400 having a modular master scan flip-flop 410 and slave scan flip-flop 420 applied to a functional flip-flop arrangement for an application circuit. This embodiment may be used anywhere a scan flip-flop is required. Master scan flip-flop 410 and slave scan flip-flop 420 provide the scan function features for scan testing. Master scan flip-flip 410 has an input 412 to receive scan input, SI, and an input 414 to receive master scan clock signal, ACLK. Slave scan flip-flip 420 has an input 422 to receive slave scan clock signal, BCLK, and an output 424 to provide scan output, SO. ACLK and BCLK are non-overlapping clock signals that run at a relatively slow speed, typically around 200 MHZ. ACLK and BCLK scan clock signals are not so limited as to running at a relatively slow speed, but can be run at higher speeds compatible with testing procedures and testing apparatus.

The scan circuitry of master scan flip-flop 410 and slave scan flip-flop 420 is added on to a master functional flip-flop 430. Master functional flip-flop 430 has an input 432 to receive data for the application for which master functional flip-flop 430 is constructed. Master functional flip-flop 430 has an input 434 to receive a system functional clock, CLK. Master functional flip-flop 430 is coupled to a slave functional flip-flop 440 through which a signal is sent to output 442 providing Q.

During a function mode, the functional output, Q, is fully decoupled from the scan output, SO, which is the output of the slave scan flop 420. Such decoupling is realized by a pass gate 438 and the states of ACLK, BCLK, and CLK and the fact that Q and SO are derived from two different electrical nodes, 442 and 424, respectively. During a scan test, non-overlapping scan clocks ACLK, BCLK are activated and CLK is in an off state. With CLK in an off state, pass gate 438 does not allow DATA to process through to output 442 to affect the Q state. Pass gate 438 also allows master functional flip-flop 430 and master scan flip-flop 410 to share slave functional flip-flop 440. Slave functional flip-flop 440 couples master scan flip-flop 410 to the scan master functional flip-flop 430. During functional applications, scan clock signals ACLK and BCLK are in an off state, and there is no scan input to affect the Q state.

Since no devices are injected into the functional path that starts with the input 432 for DATA and terminates at output 442 with Q, the scan circuit of sequential scan cell 400 causes no performance penalty and adds no delay to the functional path. Additionally, with the ACLK and BCLK clocks idle in functional mode, there is no power dissipation caused by the scan circuit that includes master scan flip-flop 410 and slave scan flip-flop 420.

The scan circuitry can be added, or "bolted on", to the functional circuitry including master functional flip-flop 430 and salve functional flip-flop 440. Scan output, SO, at output 424 drives a single sink point, allowing the size of the transistor device driving such a signal to be constant throughout the chip. This allows the scan circuitry to be added as a fixed "bolted on" piece wherever a scan flip-flop is needed. Further, in an embodiment where the scan circuitry runs at a relatively slow frequency, the size of the devices comprising the scan circuitry does not have to be large. This allows the flip-flop to use a minimal amount of area on a chip required to implement the scan function.

Additionally, since the ACLK and BCLK scan clock signals as well as the SO and SI are idle during functional mode, the wires on which these signals are transmitted carry no signal. These wires, which may be metallizations or traces on a chip, are routed such that they can be used to provide electrical shielding for the functional signals DATA, CLK, and Q.

Figure 5:
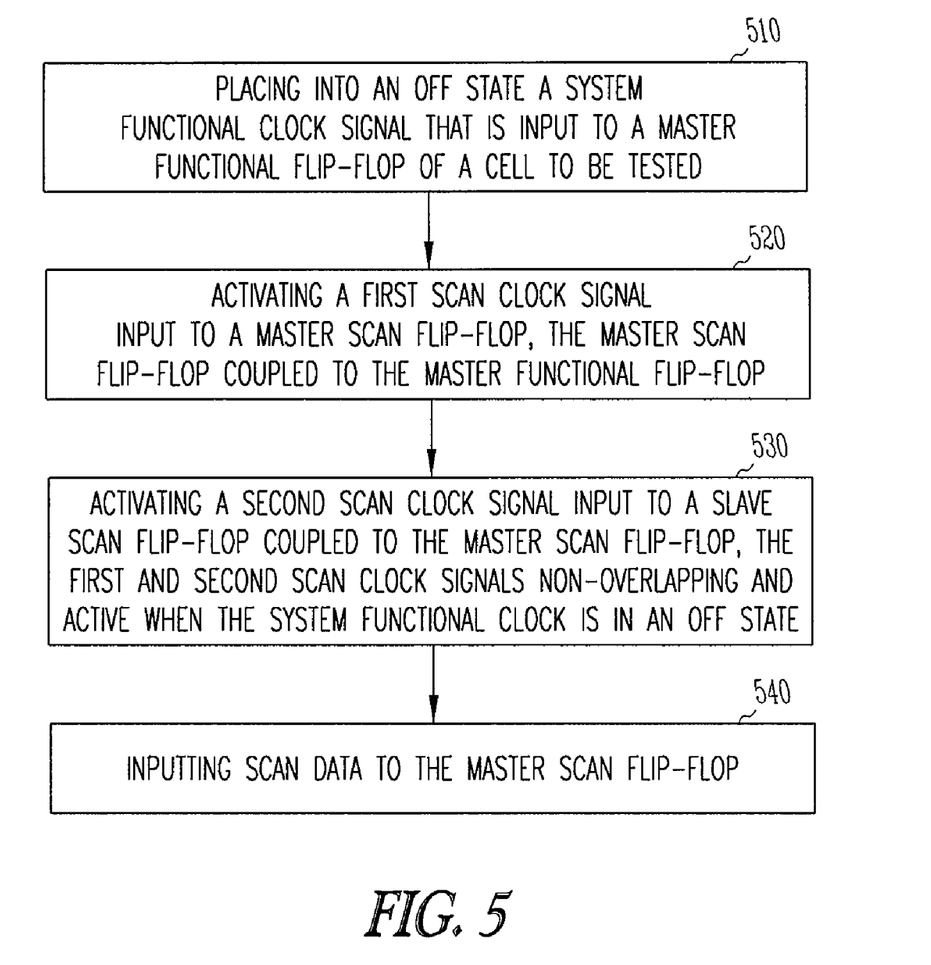
FIG. 5 shows a flowchart of an embodiment for scan testing using the master scan flip-flop and the slave scan flip of FIG. 4, in accordance with the present invention.

FIG. 5 shows a flowchart of an embodiment of a method for scan testing using the master scan flip-flop and the slave scan flip of FIG. 4. This embodiment includes placing into an off state a system functional clock signal that is input to master functional flip-flop 430 of sequential scan cell 400 to be tested, at block 510, activating a first scan clock signal input to master scan flip-flop 410, at block 520, where the master scan flip-flop 410 is coupled to the master functional flip-flop 430, activating a second scan clock signal input to slave scan flip-flop 420 coupled to the master scan flip-flop 410, at block 530, where the first and second scan clock signals non-overlapping and are active when the system functional clock signal is in an off state, and inputting scan data to the master scan flip-flop, at block 540. A state of the processor is stored in the functional slave flop. Consequently, scan out operations start with the BCLK scan clock signal being pulsed first prior to the ACLK scan clock signal. This initial BCLK signal transfers the content of the slave function flip-flop 440 to the scan slave flip-flop 420.

After the input scan data is scanned into the sequential cell, then the functional system clock is activated to do a launch and a capture. By activating the system functional clock, a stimulus and a capture of that stimulus through the combinatorial logic that sits in between sequential cells is achieved. After a launch and capture using the system functional clock, the Q is in a state to be read, basically to be measured, such that a determination can be made as to whether the test was successful or not. To be able to read Q, to measure it, it is scanned out to a chip input/output pin so that a tester can decide whether the test was passed or not. To scan the data out, the BCLK is pulsed to read Q as the scan output, SO. Though Q is decoupled from SO in a functional mode, in test mode Q is read as SO from the scan slave flip-flop 420. The data scanned out, SO, is provided to a tester from a slave scan flip-flop that is the last one in a chain of sequential scan cells. For slave scan flip-flops not at the end of a chain of sequential scan cells, data scanned out, SO, is provided to the next sequential cell that also receives the master and slave scan clock signals, ACLK and BCLK, along with the system functional clock signal, CLK.

Figure 6:
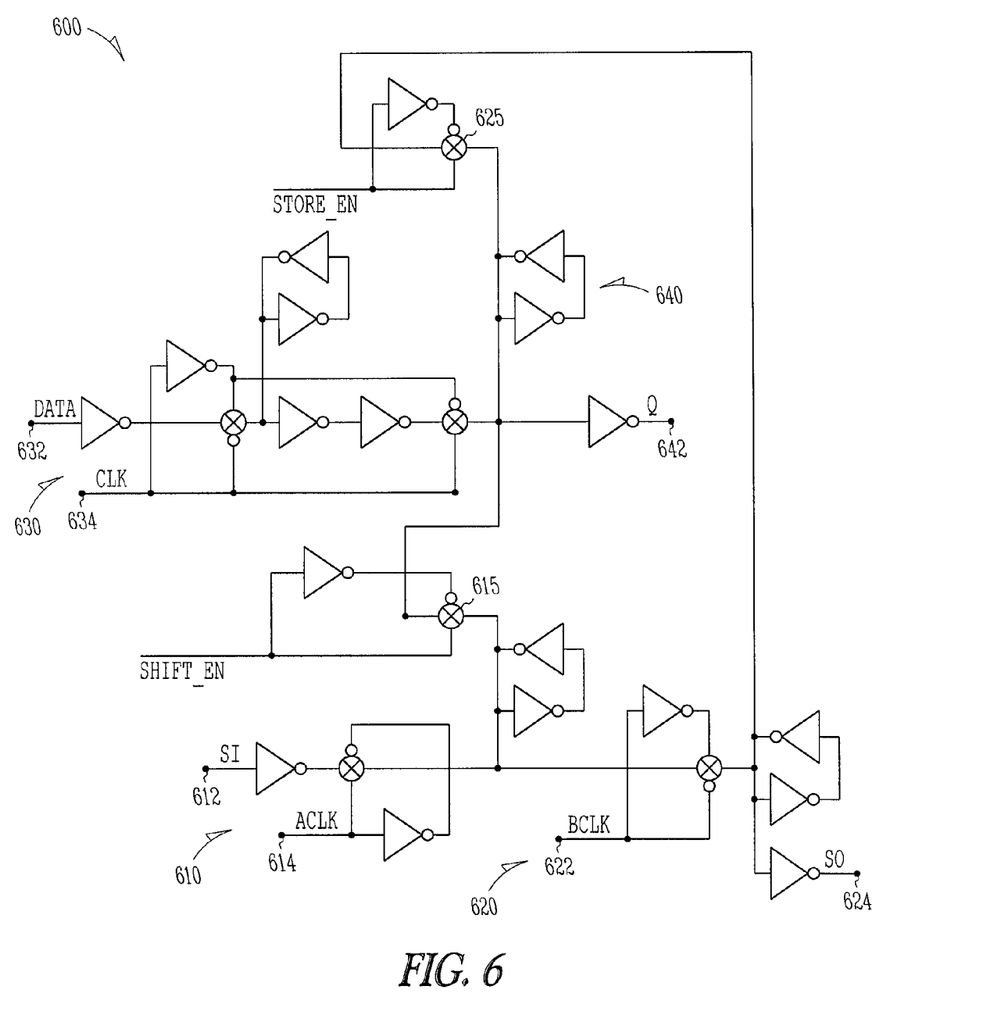
FIG. 6 illustrates an embodiment of a sequential scan cell having modular master scan flip-flop and slave scan flip-flop applied to a functional flip-flop arrangement for an application circuit including circuitry to address contention during scanning, in accordance with the present invention.

FIG. 6 illustrates an embodiment of a sequential scan cell 600 having modular master scan flip-flop 610 and slave scan flip-flop 620 applied to a functional flip-flop arrangement for an application circuit including circuitry to address contention during scanning.

A contention problem may occur during scanning of the scan based sequential cell of FIG. 4 because the Q output is toggling during scan. This toggling is the result of functional slave flip-flop 440 being shared by master functional flip-flop 430 and scan master flip-flop 410. Contention may occur because the slave flop is a shared scan and functional flop with random scan data being shifted through the input 412 of master scan flip-flop 410. Additionally, if two functional outputs, Q1 and Q2, each from different scan based sequential cells, drive the same electrical node, contention may also occur. The embodiment illustrated in FIG. 6 avoids this situation with its Q output idle and prevented from toggling during scanning.

In FIG. 6, master scan flip-flip 610 has an input 612 to receive scan input, SI, and an input 614 to receive master scan clock signal, ACLK. Slave scan flip-flip 620 has an input 622 to receive slave scan clock signal, BCLK, and an output 624 to provide scan output, SO. ACLK and BCLK are non-overlapping clocks that run at a relatively slow speed, typically around 200 MHZ. ACLK and BCLK scan clock signals are not so limited as to running at a relatively slow speed, but can be run at higher speeds compatible with testing procedures and testing apparatus.

The scan circuitry of master scan flip-flop 610 and slave scan flip-flop 620 is added on to a master functional flip-flop 630. Master functional flip-flop 630 has an input 632 to receive data for the application for which master functional flip-flop 630 is constructed. Master functional flip-flop 630 has an input 634 to receive a system functional clock, CLK. Master functional flip-flop 630 is coupled to a slave functional flip-flop 640 through which a signal is sent to output 642 providing Q.

Master scan flip-flop 610 is coupled to master functional flip-flop 630 by a pass gate, or transmission gate, 615. Pass gate 615 is responsive to a shift-enable signal, SHIFT_EN. SHIFT_EN is a single, one time pulse during test that controls the transfer of the Q data, or its inverse, from the slave functional flip-flop 640 to a location between master scan flip-flop 610 and slave scan flip-flop 620 for the scan operation. The ACLK and BCLK scan clock signals are used to read out the results that transfers data from the Q node down to the sequential scan chain for testing. In contrast to sequential scan cell 400 of FIG. 4, the embodiment of a sequential scan cell 600 of FIG. 6 uses a shift-enable signal to pulse or transfer data into the slave scan flip-flop 620.

When scanning is taking place, the Q output is idle and constant. When the STORE_EN signal is activated, or pulsed, at the end of a scan 'write' operation, the Q node acquires its intended scan 'write' value. During scan 'read' operations, the value on the Q node is transferred to the master scan flip-flop 610, at the output of the pass-gate 615 controlled by the SHIFT_EN signal. This transfer occurs when the SHIFT_EN signal is pulsed before the scan shift operation can start.

To perform a test in a chain of sequential scan cells having a structure as in the embodiment of FIG. 6, a test vector is applied to the Q nodes, the Q nodes are stimulated, and the response is captured back at the Q nodes. In order to stimulate the Q nodes test data is scanned in using ACLK, BCLK scan clock signals. This places data at the input to pass gate, or transmission gate, 625. To transfer that data, or write that data, into the Q node, a store-enable signal, STORE_EN, is pulsed. Pass gate 625 having an input to receive STORE_EN is responsive to this signal to pass data to the Q nodes. The read write operation of sequential scan cell 600 includes a "scan in" operation using the scan clock signals, a launch operation using the functional system clock signal, and capture and "scan out" using the scan clock signals. Additionally, sequential scan cell 600 has the capability to take a snapshot of the state of the logical states of the processor while the processor is running. This debug feature requires synchronization of the SHIFT_EN signal with the system functional clock.

Sequential scan cell 600 offers the modular design of sequential scan cell 400 of FIG. 4. However, sequential scan cell 600 uses added scan chip area, overhead, and wiring as compared with sequential scan cell 400.

Figure 7:
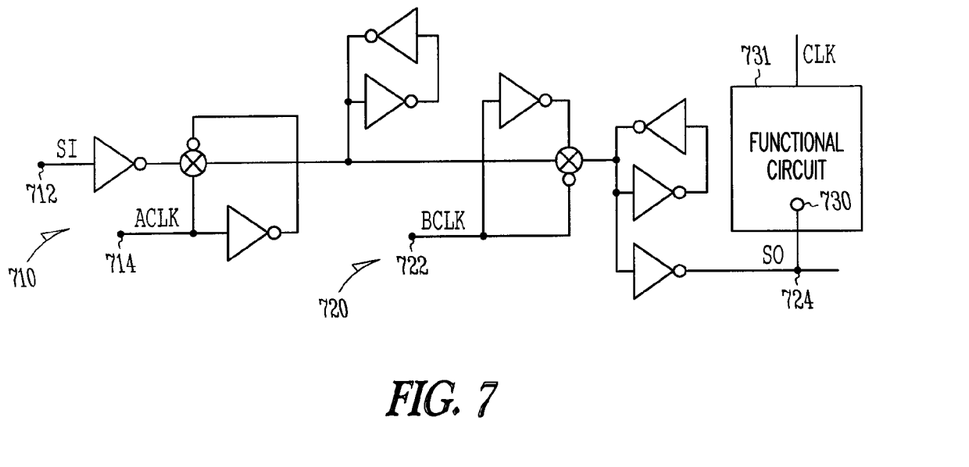
FIG. 7 illustrates an embodiment of a master scan flip-flop and slave scan flip-flop to set a control node in a circuit to a known and constant value, in accordance with the present invention.

FIG. 7 illustrates an embodiment of a master scan flip-flop 710 and slave scan flip-flop 720 to set a control node in a circuit to a known and constant value. Master scan flip-flip 710 has an input 712 to receive scan input, SI, and an input 714 to receive master scan clock signal, ACLK. Slave scan flip-flip 720 has an input 722 to receive slave scan clock signal, BCLK, and an output 724 to provide scan output, SO. Output 724 is coupled to a control node 730 of a functional circuit 731. ACLK and BCLK are non-overlapping clocks that run at a relatively slow speed, typically around 200 MHZ. ACLK and BCLK scan clock signals are not so limited as to running at a relatively slow speed, but can be run at higher speeds compatible with testing procedures and testing apparatus. The ACLK, BCLK scan clock signals are decoupled from functional system clocks.

A scan operation, or shift operation, can be performed to "scan in" data, SI, at input 712 using ACLK scan clock signal. Then the data is provided at output 724 as SO using BCLK scan clock signal. With output coupled to control node 730, control node 730 can be set to a constant value for use by the functional circuit 731 including control node 730. In an embodiment, a number of functional nodes are coupled to output node 724 such that as to provide a scan output to the node at which it is desired to have to control whether it is a functional node or test node. In an embodiment, output 724 is coupled to a next scan input to provide SO as SI to the next scan input. In an embodiment, a number of control master/salve flip-flops, as described in FIG. 7, are coupled to a number of control nodes of functional application circuits within an integrated circuit.

The master scan flip-flop 710/slave scan flip-flop 720 arrangement can be used to provide an embodiment for a control-only flip-flop. In an embodiment, control registers that can be set, at system/processor configuration time, to a constant value can be implemented using the master scan flip-flop 710/slave scan flip-flop 720 arrangement described herein. These control registers are set via a scan, or shift, operation using the ACLK and BCLK and the SI input 712. Once the SO output 724 is set to a known value, it retains that value until another scan operation takes place. In embodiments where the ACLK and BCLK are run at low frequencies, the master scan flip-flop/slave scan flip-flop control node arrangement can be constructed from relatively small devices.

Figure 8:
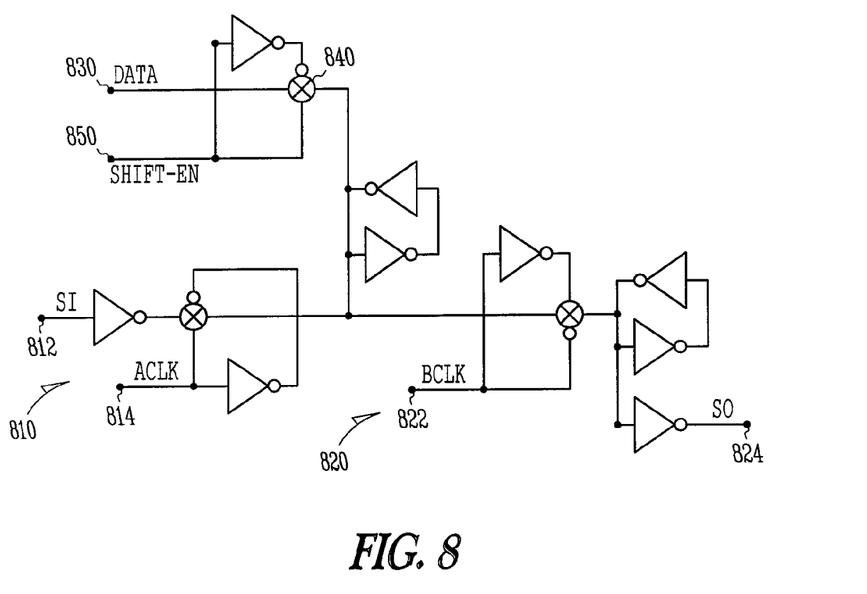
FIG. 8 illustrates an embodiment of a master scan flip-flop and slave scan flip-flop to capture values at a designated logical node, in accordance with the present invention.

FIG. 8 illustrates an embodiment of a master scan flip-flop 810 and slave scan flip-flop 820 to capture values at a designated logical node. Master scan flip-flip 810 has an input 812 to receive scan input, SI, and an input 814 to receive master scan clock signal, ACLK. Slave scan flip-flip 820 has an input 822 to receive slave scan clock signal, BCLK, and an output 824 to provide scan output, SO. Master scan flip-flop 810 is coupled to a logical node 830 of a functional portion of an application circuit by a pass-gate, or transmission gate, 840. Pass-gate 840 is coupled to logical node 830 and to a shift-enable node 850. Pass-gate 840 is responsive to a shift-enable signal, SHIFT_EN, which controls the transfer of DATA signal at logical node 830 to an input of slave scan flip-flop 820. Pulsing SHIFT_EN allows the state of logical node 830 to be read at scan output 824, which allows a state of a logical node to be observed. ACLK and BCLK are non-overlapping clocks that run at a relatively slow speed, typically around 200 MHZ. ACLK and BCLK scan clock signals are not so limited as to running at a relatively slow speed, but can be run at higher speeds compatible with testing procedures and testing apparatus. The ACLK, BCLK scan clock signals are decoupled from functional system clocks.

In an embodiment in which the SHIFT_EN signal is synchronized with the system clock, a snapshot of the designated logical node 830 in a processor, or ASIC, can be made while the processor continues to run. In an embodiment in which the SHIFT_EN signal is synchronized with the system clock, the SHIFT_EN signal is staged to meet a single cycle timing from its source to its input at the flip-flop. Alternately, the SHIFT_EN signal does not have to be synchronized to the system functional clock signal if the system functional clock is gated off before the SHIFT_EN signal is asserted. In an embodiment in which the SHIFT_EN signal is not synchronized with the system, the SHIFT_EN signal may be completely decoupled and asynchronous with respect to the system clock. In an embodiment, the SHIFT_EN signal is run as a clock signal at relatively low frequencies. With the SHIFT_EN signal not synchronized with a system clock signal, SHIFT_EN is used to dump the state of the selected node of the processor only after the system clocks have been stopped. In an embodiment, a number of such observe flip-flops are realized to observe a number of logical nodes of a processor or ASIC in which they are embedded. In embodiment, SI input 812 and SO scan output 824 enable the inclusion of this flip-flop into a global scan chain. ACLK and BCLK are the scan clock signals that control the scan operation through the master and slave scan stages, respectively, in such a global scan chain.

Embodiments as shown in FIG. 8 can be used anywhere in a circuit where additional observable access is required to improve test coverage or debug capability. Such flip-flops can be used in an embedded array pre-logic and post-logic topology. Also, it can be used in between pipe-stages of the circuit where observable access is desired for ATPG or debug purposes but inserting a sequential scan cell, such as sequential scan cell 400 shown in FIG. 4, in series with the dataflow is not acceptable because of growth in the critical dimension or pipe timing.

Further, master scan flip-flop 810 and slave scan flip-flop 820 forming an observe flip-flop is a relatively compact flip-flop with a small area. In embodiments in which the SHIFT_EN runs as a clock at about 200 MHZ, it does not dissipate any power during functional application, since the controlling SHIFT_EN signal is only active in ATPG mode.

Figure 9:
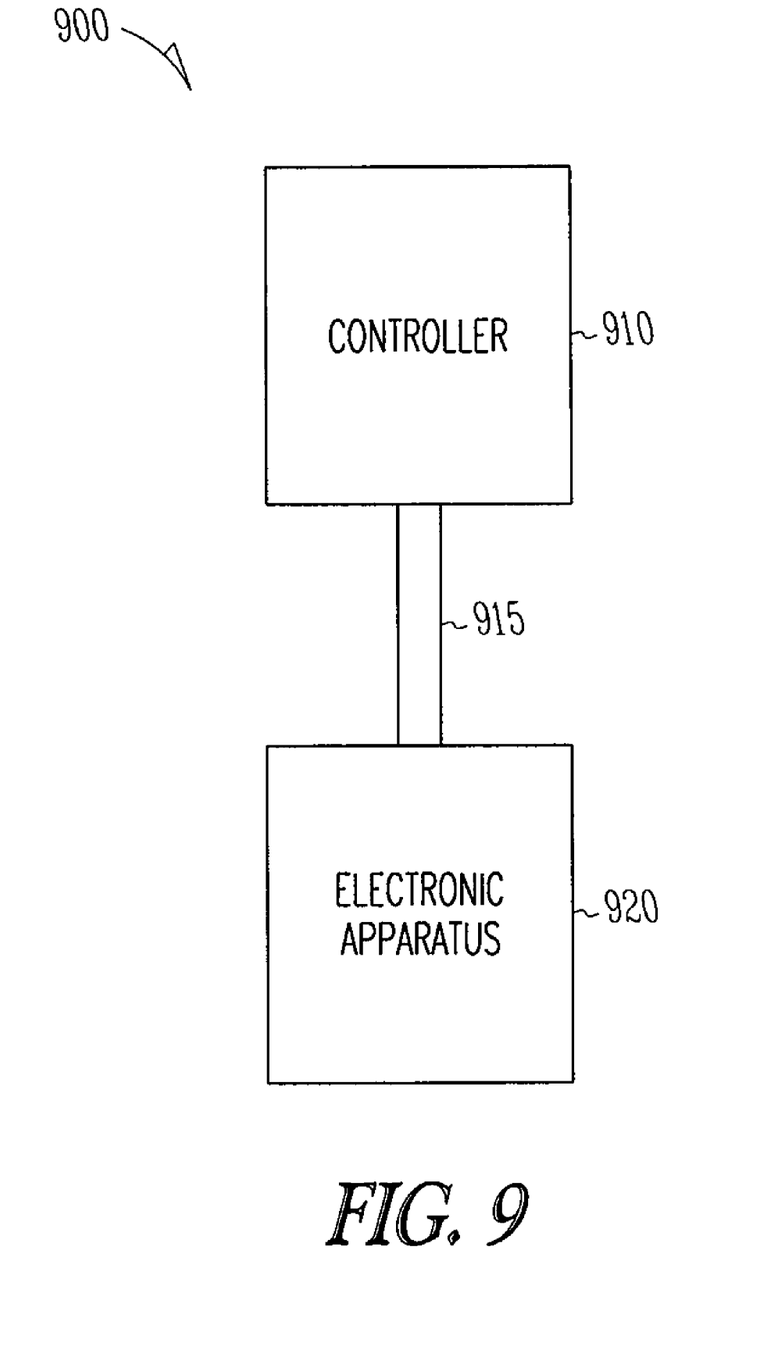
FIG. 9 illustrates a block diagram for a system using an embodiment for test scan cells, in accordance with the present invention.

FIG. 9 illustrates a block diagram for a system 900 using an embodiment for test scan cells. System 900 includes a controller 910, a bus 915, and an electronic apparatus 920, where bus 915 provides electrical conductivity between controller 910 and electronic apparatus 920. In various embodiments, controller 910 and/or electronic apparatus 920 include an embodiment for a test scan cell as described herein. Electronic system 900 may include, but is not limited to, information handling devices, wireless systems, telecommunication systems, fiber optic systems, electro-optic systems, and computers. In an embodiment, controller 910 is a scan based processor and electronic apparatus 920 is a testing apparatus. The testing apparatus may include ATPG equipment or a debug system. In an embodiment, controller 910 is a scan based ASIC device and electronic apparatus 920 is a testing apparatus. The testing apparatus may include ATPG equipment or a debug system. In another embodiment, controller 910 is a scan based controller and electronic apparatus 920 is a memory device. The scan based controller may be a scan based processor or a scan based ASIC device.

Various embodiments of scan flips-flops as described herein provide for implementing a scan based processor using scan flip-flops that have a clocking scheme in which ACLK and BCLK scan clocks are non-overlapping and completely decoupled from the system clock. Such scan flip-flop arrangements provide no performance penalty to a functional signal, that is, there is no delay impact to the application circuit. Also, no power is dissipated when the application circuit is in functional mode. With respect to physical layout, such embodiments of scan flip-flops have small scan area overhead and a modular design approach as the scan portion of the circuit can be designed as an add on, or bolted on, portion to the functional portion. Such flip-flops support automated test pattern generation based manufacturing and system debug through scan chains.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon reviewing the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An apparatus, comprising:
   a control node of a functional circuit of an application circuit, the functional circuit having a system functional clock signal input, the application circuit disposed on an integrated circuit;
   a master scan flip-flop disposed on the integrated circuit, the master scan flip-flop having inputs to receive scan data and a first scan clock signal; and
   a slave scan flip-flop disposed on the integrated circuit and coupled to the master scan flip-flop, the slave scan flip-flop having a scan data output and an input to receive a second scan clock signal, the master scan flip-flop and the slave scan flip-flop operatively coupled to the functional circuit such that active circuitry of the master scan flip-flop and the slave scan flip-flop are independent of the functional circuit, wherein the first scan clock signal and the second scan clock signal are non-overlapping and are active when the system functional clock signal is in an off state, the scan data output coupled to the control node to set a value to operate the functional circuit at the control node when the system functional clock signal is in an on state.

2. The apparatus of claim 1, further including the first and second scan clock signals routed from a source different than a source from which the system functional clock signal is routed.

3. The apparatus of claim 1, wherein the apparatus includes a number of sequential cells, the sequential cells disposed on the integrated circuit, each sequential cell having:
   a functional circuit of the application circuit, the functional circuit having a system functional clock signal input and a functional data output;
   a master scan flip-flop, the master scan flip-flop having inputs to receive scan data and the first scan clock signal; and
   a slave scan flip-flop coupled to the master scan flip-flop, the slave scan flip-flop having a scan data output and an input to receive the second scan clock signal, the master scan flip-flop and the slave scan flip-flop operatively coupled to the functional circuit such that active circuitry of the master scan flip-flop and the slave scan flip-flop are independent of the functional circuit, the scan data output being different from the functional data output.

4. The apparatus of claim 3, wherein a first sequential cell of the number of sequential cells includes a pass gate coupled to the master scan flip-flop of the first sequential cell ad the slave scan flip-flop of the first sequential cell, the pass gate having an input to receive functional data and an input to receive a shift-enable signal to control observation of the functional data of the first sequential cell.

5. The apparatus of claim 4, wherein the shift-enable signal is synchronized to the system functional clock signal.

6. The apparatus of claim 3, wherein each sequential cell includes a pass gate to decouple, in a functional mode, a signal at the functional data output from the scan data output of the slave scan flip-flop.

7. The apparatus of claim 3, further including wires to provide the first scan clock signal to the master scan flip-flop, to provide the second scan clock signal to the slave scan flip-flop, to provide scan data to the master scan flip-flop, and to provide scan output data from the slave scan flip-flop such that, in a functional mode, the wires provide electrical shielding for data received by the functional circuit, the functional clock signal, and an output data signal from the functional output.

8. The apparatus of claim 3, wherein the master scan flip-flop of each sequential cell is coupled to a master functional flip-flop of the functional circuit of the respective sequential cell through a shared slave functional flip-flop.

9. The apparatus of claim 1, wherein the apparatus is configured to operate the first scan clock signal and the second scan clock signal at about 200 MHz.

10. The apparatus of claim 3, wherein the master scan flip-flop of each sequential cell is coupled to a master functional flip-flop of the functional circuit of the respective sequential cell through a first pass gate responsive to a shift-enable clock signal.

11. The apparatus of claim 10, wherein each sequential cell includes a second pass gate coupled to a slave functional flip-flop of the functional circuit of the respective sequential cell, the functional circuit coupled to the master functional flip-flop, the second pass gate responsive to a store-enable signal to place a scan value at the functional data output in a scanning operation.

12. The apparatus of claim 11, wherein the slave scan flip-flop is coupled to an input of the second pass gate.

13. A method comprising:
   activating a first scan clock signal input to a master scan flip-flop;
   activating a second scan clock signal input to a slave scan flip-flop, the slave scan flip-flop coupled to the master scan flip-flop, the master scan flip-flop and the slave scan flip-flop disposed on an integrated circuit to interact with a functional circuit of an application circuit disposed on the integrated circuit, such that active circuitry of the master scan flip-flop and the slave scan flip-flop are independent of the functional circuit of the application circuit, the first and second scan clock signals non-overlapping and active when a system functional clock signal is in an off state;
   inputting scan data to the master scan flip-flop; and
   providing an output signal from the slave scan flip-flop to control nodes of the functional circuit of the application circuit to set the control nodes to a constant value to operate the functional circuit of the application circuit at the control node when the system functional clock signal is in an on state.

14. The method of claim 13, wherein the method includes placing into an off state the system functional clock signal that is input to a master functional flip-flop of a sequential cell of a set of sequential cells, the sequential cell including another portion of the functional circuit of the application circuit;
   activating the first scan clock signal input to a master scan flip-flop of the sequential cell, the master scan flip-flop coupled to the master functional flip-flop;
   activating the second scan clock signal input to a slave scan flip-flop of the sequential cell, the slave scan flip-flop coupled to the master scan flip-flop, the master scan flip-flop and the slave scan flip-flop configured in the cell such that active circuitry of the master scan flip-flop and the slave scan flip-flop are independent of the application circuit, the functional circuit of the application circuit having a functional data output, the slave scan flip-flop having a scan data output different from the functional data output; and
   inputting scan data to the master scan flip-flop.

15. The method of claim 14, wherein the method further includes activating a shift-enable signal input to a pass gate coupled to the master scan flip-flop of the sequential cell and the slave scan flip-flop of the sequential cell to control capturing data input to a functional logic node of the application circuit.

16. The method of claim 15, wherein the method further includes activating the shift-enable signal only in an automatic test pattern generation mode.

17. The method of claim 15, wherein the method further includes synchronizing the shift-enable signal with the system functional clock signal.

18. A system comprising:

a scan based processor; and an electronic device coupled to the scan based processor, wherein the scan based processor has scan cells, at least one scan cell including:

a functional circuit having a control node, the functional circuit having a system functional clock signal input;

a master scan flip-flop having an input to receive scan data and an input to receive a first scan clock signal; and a slave scan flip-flop coupled to the master scan flip-flop, the slave scan flip-flop having a scan data output and an input to receive a second scan clock signal, the master scan flip-flop and the slave scan flip-flop operatively coupled to the functional circuit such that active circuitry of the master scan flip-flop and the slave scan flip-flop are independent of the functional circuit, wherein the first scan clock signal and the second scan clock signal are non-overlapping and are active when the system functional clock signal is in an off state, the scan data output coupled to the control node to set a value at the control node to operate the functional circuit at the control node when the system functional clock signal is in an on state.

19. The system of claim 18, the scan based processor has routes to route the first and second scan clock signals from a source different than a source from which the system functional clock signal is routed.

20. The system of claim 18, wherein the scan cells include a number of sequential cells, each sequential cell having a master scan flip-flop coupled to a slave scan flip-flop, each master scan flip-flop responsive to the first scan clock signal and each slave scan flip-flop responsive to the second scan clock signal.

21. The system of claim 20, wherein the sequential cells include at least one sequential cell having a pass gate coupled to a master scan flip-flop of the at least one sequential cell and a slave scan flip-flop of the at least one sequential cell, the pass gate having inputs to receive functional data and a shift-enable signal to observe the functional data of the at least one sequential cell.

22. The system of claim 20, wherein the sequential cells include at least one sequential cell having:

a master functional flip-flop of the functional circuit, the master functional flip-flop having an input to receive data and an input to receive the functional clock signal, the master functional flip-flop coupled to a master scan flip-flop of the at least one sequential cell, the master scan flip-flop to control testing of the at least one sequential cell containing the master functional flip-flop; and a functional output coupled to the master functional flip-flop.

23. The system of claim 22, wherein the master scan flip-flop is coupled to the master functional flip-flop through a shared slave functional flip-flop of the at least one sequential cell.

24. The system of claim 22, wherein the master scan flip-flop is coupled to the master functional flip-flop through a first pass gate responsive to a shift-enable clock signal.

25. The system of claim 18, wherein the electronic device includes a tester for automatic test pattern generation.

* * * * *

UNITED STATES PATENT AND TRADEMARK OFFICE
CERTIFICATE OF CORRECTION

PATENT NO. : 7,437,634 B2 Page 1 of 1
APPLICATION NO. : 10/436775
DATED : October 14, 2008
INVENTOR(S) : Jaber et al.

It is certified that error appears in the above-identified patent and that said Letters Patent is hereby corrected as shown below:

In column 11, line 53, in Claim 4, delete "ad" and insert -- and --, therefor.

Signed and Sealed this

Tenth Day of February, 2009

JOHN DOLL
*Acting Director of the United States Patent and Trademark Office*